United States Patent [19]
Ikeda

[11] Patent Number: 5,961,715
[45] Date of Patent: Oct. 5, 1999

[54] METHOD FOR PULLING A SINGLE CRYSTAL

[75] Inventor: Naoki Ikeda, Hyogo pref., Japan

[73] Assignee: Sumitomo Sitix Corporation, Amagasaki, Japan

[21] Appl. No.: 08/803,521

[22] Filed: Feb. 20, 1997

[30] Foreign Application Priority Data

Feb. 23, 1996 [JP] Japan .................................. 8-036400

[51] Int. Cl.⁶ .................................................. C30B 15/22
[52] U.S. Cl. ................................ 117/13; 117/14; 117/15
[58] Field of Search ................................. 117/13, 14, 15

[56] References Cited

U.S. PATENT DOCUMENTS

| | | | |
|---|---|---|---|
| 4,058,429 | 11/1977 | Duncan et al. ........................... | 117/15 |
| 4,421,721 | 12/1983 | Byer et al. .............................. | 117/202 |
| 4,597,949 | 7/1986 | Jasinski et al. ......................... | 117/217 |
| 5,137,699 | 8/1992 | Azad ....................................... | 117/202 |
| 5,223,077 | 6/1993 | Kaneko et al. ........................... | 117/34 |

*Primary Examiner*—Felisa Hiteshew
*Attorney, Agent, or Firm*—Armstrong, Westerman, Hattori, McLeland & Naughton

[57] ABSTRACT

A method and apparatus for pulling a single crystal by, for example, the Czochralski method where a melt is heated by heaters arranged around, or around and below a crucible. Auxiliary heaters are provided above the crucible to directly heat the melt to supplement the heaters arranged around, or around and below the crucible, so as to reduce the power of the heaters arranged around, or around and below the crucible. According to the method, a single crystal is pulled under the condition of the local highest temperature of a quartz crucible of 1600° C. or less.

1 Claim, 3 Drawing Sheets

METHOD FOR PULLING A SINGLE CRYSTAL

BACKGROUND OF THE INVENTION

1. Field of the Invention

The present invention relates to a method and an apparatus for pulling a single crystal and, more particularly, a method and an apparatus for pulling a single crystal wherein a single crystal of silicon or the like is pulled by the Czochralski method (hereinafter, referred to as CZ method) and the like.

2. Description of the Relevant Art

As a silicon single crystal ingot used for manufacturing a substrate for forming a circuit component of a LSI (large scale integrated circuit) and the like, a silicon single crystal pulled by the CZ method has been mainly used. FIG. 3 is a diagrammatic sectional view of an apparatus for pulling a single crystal used for the CZ method, and in the figure, reference numeral 11 represents a crucible.

The crucible 11 comprises a bottomed cylindrical quartz crucible 11a and a bottomed cylindrical graphite crucible 11b fitted on the outer side of the quartz crucible 11a and supporting the quartz crucible 11a. The crucible 11 is supported with a support shaft 18 which rotates in the direction shown by the arrow in the figure at a prescribed speed. A cylindrical heater 12a of a resistance heating type and a perforated discoidal heater 12b are arranged around and below the crucible 11, respectively. A heat insulating mould 17 is concentrically arranged around the heater 12a. The crucible 11 is charged with a melt 13 of a material for forming a crystal which is melted by the heater 12a. On the central axis of the crucible 11, a pulling axis 14 made of a pulling rod or wire is suspended, and at the lower end part thereof, a seed crystal 15 is held by a seed chuck 14a. Each part mentioned above is arranged at a fixed place in a water cooled type chamber 19 wherein pressure and temperature can be controlled.

In pulling a single crystal 26, the pressure in the chamber 19 is reduced and kept in the reduced state for an appropriate period of time so as to sufficiently release a gas contained in the melt 13. Then an inert gas is introduced into the chamber from the upper part, so as to make an inert gas atmosphere under reduced pressure within the chamber. In the step of seeding, the seed crystal 15 held at the lower end of the pulling axis 14 is brought into contact with the surface of the melt 13, so as to slightly melt the front portion of the seed crystal 15 melt. In the next step of necking, while the pulling axis 14 is rotated on the same axis in the reverse direction of the support shaft 18 at a prescribed speed, a crystal (neck) having a diameter narrowed down to 2–4 mm and a length of 20–40 mm is made to grow from the lower end portion of the seed crystal 15. After the necking step, the diameter of the single crystal 26 is gradually increased to form a shoulder having a prescribed diameter, and then, a main body is pulled which forms to a product.

In the last stage of the pulling, in order to prevent inducement of high density dislocation from being caused by a steep temperature gradient, the diameter of the single crystal 26 is decreased, leading to the formation of an end-cone and a tail end, and then, the single crystal 26 is separated from the melt 13. Cooling the single crystal 26 is at the end of the pulling. As described above, pulling a single crystal 26 comprises a great number of steps, and in general, it takes several tens of hours from melting a material for a crystal to the completion of pulling a single crystal 26.

Recently, in order to achieve more efficient production of a single crystal ingot and improvement in the yield of chips, the diameter of a pulled single crystal ingot has gradually become larger and the quantity of material for a single crystal required at one pulling has also become larger. Accordingly, the diameter of the crucible to make the material for a single crystal melt therein has also become larger, the required power of a heater has also become higher, and the time required for pulling a single crystal has also become longer. Consequently, a quartz crucible in direct contact with the melt has been exposed to a high temperature for a long period of time, resulting in more and more serious deterioration thereof. The deterioration of the quartz crucible allows bubbles entrained therein to grow, and when the bubbles are released, the melt is contaminated with quartz particles. When the quartz particles become incorporated into a single crystal at the crystal growth interface, the occurrence rate of dislocation increases.

SUMMARY OF THE INVENTION

The present invention was developed in order to solve the above described problems, and it is an object of the present invention to provide a method and an apparatus for pulling a single crystal, by which deterioration of a quartz crucible caused by exposure to a high temperature for a long period of time can be prevented, so that occurrence of dislocation caused by the crucible deterioration can be inhibited.

In order to achieve the above object, the method for pulling a single crystal according to the present invention, wherein a single crystal is pulled by dipping a seed crystal into a melt formed in a quartz crucible, is characterized by having the condition of the local highest temperature of the quartz crucible of 1600° C. or less.

With the above method for pulling a single crystal, deterioration of the quartz crucible can be prevented and an occurrence rate of dislocation in a single crystal caused by the crucible deterioration can be held down.

The apparatus for pulling a single crystal according to the present invention, which is used for the above method for pulling a single crystal, is characterized by having heaters for heating a melt in a quartz crucible above and around, or above, below and around the quartz crucible.

Using the above apparatus for pulling a single crystal, a melt can be directly heated by the heaters arranged above the quartz crucible, so that a local rise in crucible temperature caused by occurrence of temperature unevenness of the quartz crucible can be prevented. As a result, deterioration of the quartz crucible can be prevented, the life span thereof can be lengthened, and occurrence of dislocation in a single crystal can be inhibited.

DETAILED DESCRIPTION OF THE INVENTION

The embodiments of a method and an apparatus for pulling a single crystal according to the present invention are described below by reference to those Figures.

Figure 1:
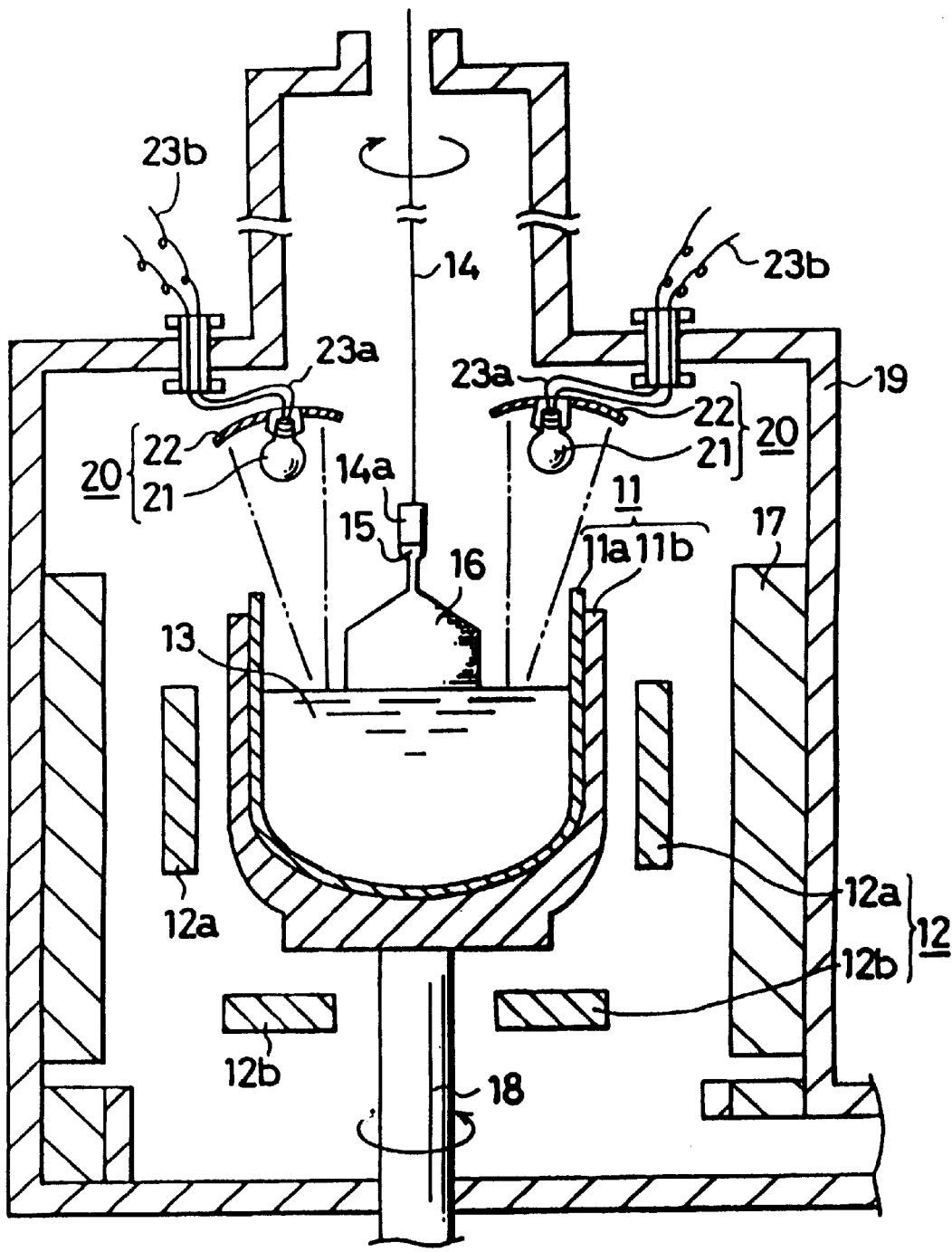
FIG. 1 is a diagrammatic sectional view showing an apparatus for pulling a single crystal according to the present invention.
Figure 3:
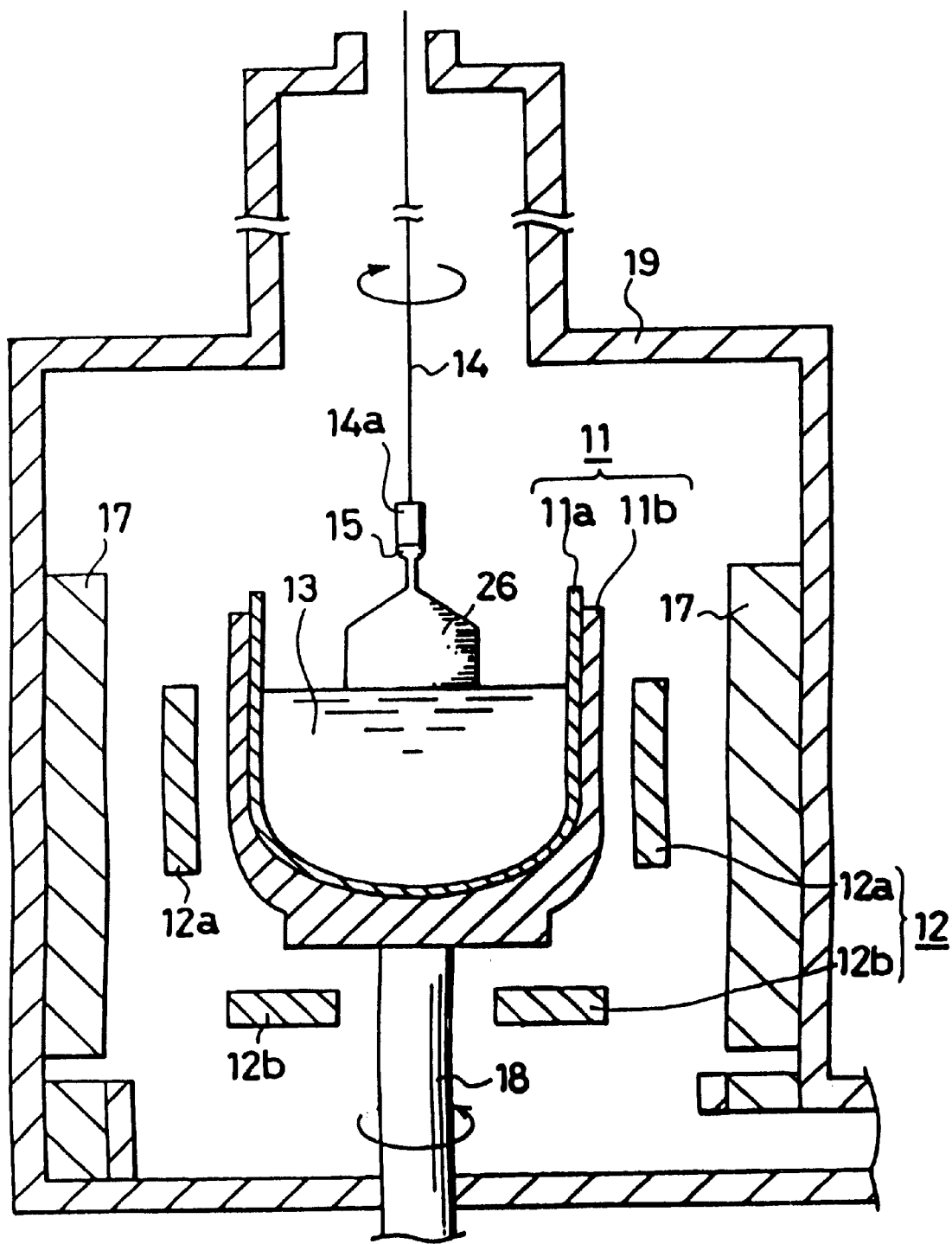
FIG. 3 is a diagrammatic sectional view showing an apparatus for pulling a single crystal used for the conventional CZ method.

FIG. 1 is a diagrammatic sectional view of an apparatus for pulling a single crystal according to the embodiments of the invention, and the apparatus is similar to the conventional apparatus for pulling a single crystal shown in FIG. 3 except for auxiliary heaters 20 arranged above a crucible 11. Accordingly, here, the description of the composition of the other parts of the apparatus for pulling a single crystal according to the embodiments is omitted and the auxiliary heater 20 is described.

The auxiliary heater 20, comprising an infrared lamp 21 and a mirror 22, the lamp having associated internals leads 23a and external leads 23b, can directly heat the melt 13 by gathering within a quartz crucible 11a infrared radiation emitted from the infrared lamp 21 by means of the mirror 22. The infrared lamp 21 and the mirror 22 fixed on the upper wall of a chamber 19 are required to have heat resistance. As a material for the mirror 22, a heat-resistant metal such as W and Mo is preferable. A bulb and a heating element constituting the infrared lamp 21 are preferably made of vitreous silica or the like, and tungsten or the like, respectively. It is advantageous that the auxiliary heater 20 is located as close to the melt 13 as possible, but taking into consideration the heat resisting properties of the materials constituting the auxiliary heater 20, it is desirable that the auxiliary heater 20 be located about 200 mm above the melt surface.

Here, in the present embodiments, an infrared lamp 21 forming part of the auxiliary heater 20 is exemplified, but in other embodiments, a carbon heater, laser generator, electron beam generator, or high frequency heater and so on may be used as part of the auxiliary heater 20.

A method for pulling a single crystal according to the embodiments of the present invention is described below.

After a crucible 11 is charged with a material for forming a crystal, heaters 12a and 12b arranged around and below the crucible 11 are turned on to heat and melt the material for forming a crystal in the crucible 11. In this case, too, using auxiliary heaters 20 makes it possible to melt the material for forming a crystal more rapidly in the quartz crucible 11a having a lowered highest temperature.

In addition, in pulling a single crystal 16, irradiating the surface of the melt 13 with an infrared radiation using the auxiliary heaters 20 and directly heating the melt 13 make it possible to decrease power of the heaters 12a and 12b arranged around, or around and below, the crucible 11 and keep the hottest part of the quartz crucible 11a at 1600° C. or less.

Here, a method for pulling a single crystal 16 by the CZ method is described, but in a method known as melting method wherein a molten layer and a solid layer are formed as the upper part and the lower part within the quartz crucible 11a, respectively, to pull a single crystal 16, using auxiliary heaters 20 according to the invention enables an excessive rise in local temperature of the quartz crucible 11a to be inhibited, resulting in inhibition of the occurrence of dislocation in the single crystal 16.

EXAMPLES

Examples and a Comparative Example of a method and an apparatus for pulling a single crystal according to the present invention are described below. In each Example, using the apparatus for pulling a single crystal shown in FIG. 1, a silicon single crystal 16 having a diameter of 6 inches and a length of 500 mm was produced. The conditions are shown in the Tables below. As a Comparative Example, the data of the case wherein a silicon single crystal 26 was produced in the same manner using the conventional apparatus for pulling a single crystal shown in FIG. 3 are also shown in the Tables below.

TABLE 1

Apparatus for pulling a single crystal used in the present invention

| | |
|---|---|
| Type of heater 12a | Resistance heating-type |
| Dimentions of heater 12a | Inside diameter: 730 mm |
| | Outside diameter: 780 mm |
| | Thickness: 25 mm |
| Auxiliary heater 20 | Combination of infrared lamp 21 and mirror 22 (two heaters) |
| Vertical distance between upper rim of crucible 11 and auxiliary heater 20 | 170 mm |
| Shape of mirror 22 | Circle in plane figure (diameter: 200 mm) |
| Dimensions of quartz crucible 11a | Diameter: 610 mm Depth: 360 mm |
| Dimensions of chamber 19 | Inside diameter: 1200 mm Height: 1880 mm |
| Atmosphere in chamber 19 | Ar atmosphere |
| Flow of Ar | 60 liters per minute |
| Pressure | 1.33 × 10³ Pa |

Prepared quantity of material: 150 kg

TABLE 2

Melting conditions of material

| | Power of heater (kW) | | | Time for melting (Hr) |
|---|---|---|---|---|
| | Heater 12a | Heater 12b | Auxiliary heater 20 | |
| Examples 1–3 | 50 | 40 | 40 | 8 |
| Comparative Example 1 (no auxiliary heater) | 70 | 40 | — | 10 |

TABLE 3

Pulling conditions

| Power of heater or else | Power of heater (kW) | | | Highest temperature of quartz crucible (° C.) | Time for pulling (Hr) |
|---|---|---|---|---|---|
| | Heater 12a | Heater 12b | Auxiliary heater 20 | | |
| Example 1 | 50 | 0 | 40 | 1500 | 28 |
| Example 2 | 59 | 0 | 32 | 1550 | 28 |
| Example 3 | 64 | 0 | 25 | 1600 | 28 |
| Comparative Example 1 | 70 | 0 | 0 | 1650 | 30 |

Note) The temperature of the quartz crucible 11a was measured with a number of thermocouples inserted between the quartz crucible 11a and the graphite crucible 11b where rotation of the crucible 11 was stopped.

TABLE 4

| Other conditions | Rotation speed of single crystal (rpm) | Pulling speed (mm/min) | Rotation speed of crucible (rpm) |
|---|---|---|---|
| Example 1 | 12 | 0.7 | 6 |
| Example 2 | 12 | 0.7 | 6 |
| Example 3 | 12 | 0.7 | 6 |
| Comparative Example 1 | 12 | 0.7 | 6 |

Figure 2:
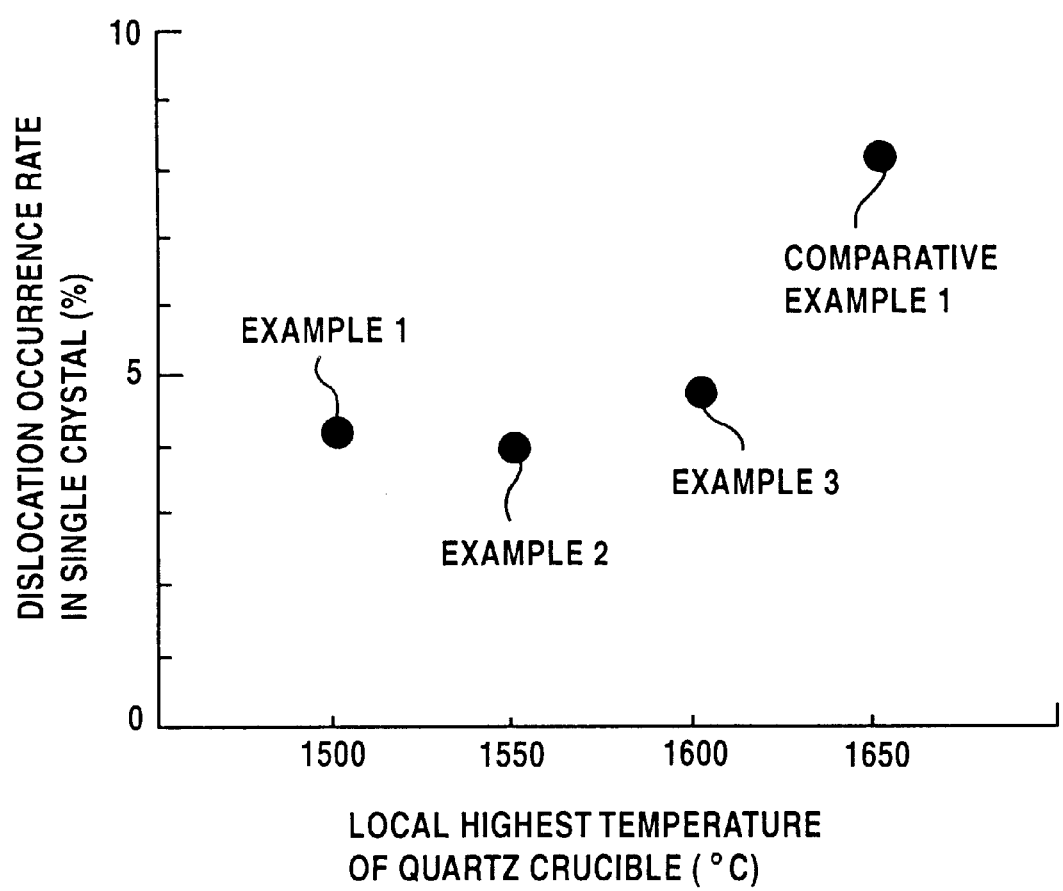
FIG. 2 is a graph indicating the relationship between the occurrence rate of dislocation in a single crystal and the local highest temperature of the quartz crucible in the Examples and in a Comparative Example.

FIG. 2 is a graph indicating the relationship between the occurrence rate of dislocation in the silicon single crystal 16 or 26 and the local highest temperature of the quartz crucible 11*a* according to Examples 1–3 and Comparative Example 1.

As obvious from FIG. 2 in Examples 1–3, each occurrence rate of dislocation was less than 5%, while in the conventional method (comparative Example 1), the occurrence rate of dislocation steeply increased to about 8% when the local highest temperature of the quartz crucible 11*a* exceeded 1600° C.

As described above, using the apparatus for pulling a single crystal according to the present invention enables the local highest temperature of the quartz crucible 11*a* to be 1600° C. or less, leading to the prevention of the deterioration of the quartz crucible 11*a*. As result, the occurrence rate of dislocation in the pulled single crystal 16 can be held to less than 5%.

What is claimed is:

1. A method of pulling a single crystal, comprising the steps of dipping a seed crystal in a metal formed in a quartz crucible and pulling a single crystal, wherein the single crystal is pulled under a condition of a local highest temperature of the quartz crucible is 1600° C. or less.

* * * * *